(12) United States Patent
Yedevelly et al.

(10) Patent No.: US 7,800,415 B2
(45) Date of Patent: Sep. 21, 2010

(54) CIRCUIT DEVICE TO PRODUCE AN OUTPUT SIGNAL INCLUDING DITHER

(75) Inventors: Yeshoda Yedevelly, Sunnyvale, CA (US); Weikang Cheng, Milpitas, CA (US)

(73) Assignee: Silicon Laboratories, Inc., Austin, TX (US)

( * ) Notice: Subject to any disclaimer, the term of this patent is extended or adjusted under 35 U.S.C. 154(b) by 0 days.

(21) Appl. No.: 12/337,989

(22) Filed: Dec. 18, 2008

(65) Prior Publication Data

US 2010/0156493 A1 Jun. 24, 2010

(51) Int. Cl.
*H03K 3/00* (2006.01)

(52) U.S. Cl. .......................................... 327/108; 326/82

(58) Field of Classification Search .................. 327/108, 327/109, 110, 111, 112; 326/82, 83
See application file for complete search history.

(56) References Cited

U.S. PATENT DOCUMENTS

| | | | | |
|---|---|---|---|---|
| 4,173,722 A | * | 11/1979 | Detering | 327/291 |
| 4,195,236 A | * | 3/1980 | Kalinichenko et al. | 327/473 |
| 4,387,399 A | * | 6/1983 | Novotny | 348/730 |
| 4,466,052 A | * | 8/1984 | Thrap | 363/41 |
| 5,079,498 A | | 1/1992 | Cleasby et al. | 323/283 |
| 5,258,904 A | | 11/1993 | de Benito et al. | 363/41 |
| 5,432,693 A | * | 7/1995 | Anderson | 363/41 |
| 5,499,177 A | * | 3/1996 | Ichihara | 363/37 |
| 5,673,166 A | | 9/1997 | Hoffman | 361/160 |
| 6,351,162 B1 | * | 2/2002 | Schwartz | 327/110 |
| 7,154,326 B2 | | 12/2006 | Swanson et al. | 327/427 |
| 7,177,166 B1 | | 2/2007 | Kris | 363/41 |
| 7,562,237 B2 | * | 7/2009 | Matsuse | 713/300 |
| 2005/0180499 A1 | | 8/2005 | Hsu | 375/238 |
| 2007/0019446 A1 | | 1/2007 | O'Loughlin | 363/41 |
| 2007/0234028 A1 | | 10/2007 | Rothman et al. | 713/1 |
| 2007/0240017 A1 | | 10/2007 | Takahashi | 714/14 |
| 2008/0279017 A1 | | 11/2008 | Shimano et al. | 365/189.06 |

OTHER PUBLICATIONS

Silicon Labs Si8250/1/2 Digital Power Controller Data Sheet, Jun. 2007.
Silicon Labs Isolation and Power Solutions, Solutions Guide, Sep. 2008.

* cited by examiner

*Primary Examiner*—Kenneth B. Wells
(74) *Attorney, Agent, or Firm*—Polansky & Associates, P.L.L.C.; R. Michael Reed

(57) ABSTRACT

In a particular embodiment, a circuit device includes a count zero circuit having a first counter to receive a clock signal and to produce a count zero signal based on the clock signal and having a second counter to generate a reset control signal to control a reset of the count zero circuit. The circuit device further includes a turnoff circuit to receive the clock signal and to produce a turn off signal based on the clock signal. Further, the circuit device includes a pulse width modulated (PWM) latch circuit adapted to produce a gate drive signal based on the count zero signal and the turn off signal, where timing of an edge of the gate drive signal varies based on the reset control signal.

20 Claims, 6 Drawing Sheets

CIRCUIT DEVICE TO PRODUCE AN OUTPUT SIGNAL INCLUDING DITHER

FIELD

The present disclosure is generally related to a circuit device to produce an output signal including dither, and more particularly, but not by limitation to, a circuit device including a programmable counter to produce an output drive signal including programmable dither.

BACKGROUND

Power converters sometimes include a pulse width modulator (PWM) circuit to produce a PWM signal that can be used to control switching of a the power conversion circuit, such as a direct current to direct current (DC/DC) circuit. In some implementations, the PWM signal can be used to control gate driver circuits of an output circuit, such as a switched power stage. However, switching of the output circuit responsive to the PWM signal can produce electromagnetic interference (EMI), which can adversely impact nearby receiver circuitry. Hence, there is a need for improved EMI suppression.

SUMMARY

In a particular embodiment, a circuit device includes a count zero circuit having a first counter to receive a clock signal and to produce a count zero signal based on the clock signal and having a second counter to generate a reset control signal to control a reset of the count zero circuit. The circuit device further includes a turnoff circuit to receive the clock signal and to produce a turn off signal based on the clock signal. Further, the circuit device includes a pulse width modulated (PWM) latch circuit adapted to produce a gate drive signal based on the count zero signal and the turn off signal, where timing of an edge of the gate drive signal varies based on the reset control signal.

In another particular embodiment, a circuit device includes a count zero circuit having a first counter to receive a clock signal and to generate a count zero signal related to the clock signal. The first counter includes a programmable reset threshold to control when the first counter circuit is reset. The count zero circuit further includes a second counter to receive the clock signal and to produce a reset control signal related to the clock signal to adjust the programmable reset threshold. The circuit device further includes a pulse width modulated (PWM) latch circuit responsive to the count zero signal to produce a gate drive signal having a first pulse edge related to the count zero signal.

In still another particular embodiment, a system includes a control processor circuit to produce a pulse width modulated (PWM) signal including dither. The control processor circuit includes a count zero circuit having a first counter circuit to produce a count zero signal and a second counter circuit to control a reset threshold associated with the first counter circuit. The control processor circuit further includes a turn off circuit to produce a turn off signal and a PWM circuit to receive the count zero signal and the turn off signal. The PWM circuit is adapted to produce a gate drive signal having a first edge related to the count zero signal and a second edge corresponding to the turn off signal, where timing associated with at least the first edge varies according to the reset threshold.

DETAILED DESCRIPTION OF ILLUSTRATIVE EMBODIMENTS

Pulse width modulated (PWM) signals can be used in switching power converters and motor control applications. Unfortunately, switching due to the PWM signals can introduce electromagnetic interference at resonant frequencies and associated harmonics. Dither can be introduced in the PWM signal to spread energy in the PWM output power spectrum. As used herein, the term "dither" refers to noise that can be added to the PWM signal to spread energy at selected frequencies within the PWM output power spectrum.

In a particular embodiment, a circuit device is disclosed that includes a first counter having a programmable reset threshold to produce an output signal that defines a rising edge of the PWM pulse. The circuit device further includes a second counter adapted to generate a threshold adjustment signal to control the programmable reset threshold. In a particular embodiment, the first and second counters can be included within a count zero circuit. The circuit device also includes a third counter circuit (e.g., a turn off circuit) adapted to generate a falling edge of the PWM pulse. In a particular embodiment, by varying the reset threshold of the first counter circuit, the timing of the PWM is varied slightly, introducing controlled noise in the PWM output signal, which noise constitutes dither that spreads energy away from selected frequencies of the output power spectrum.

Figure 1:
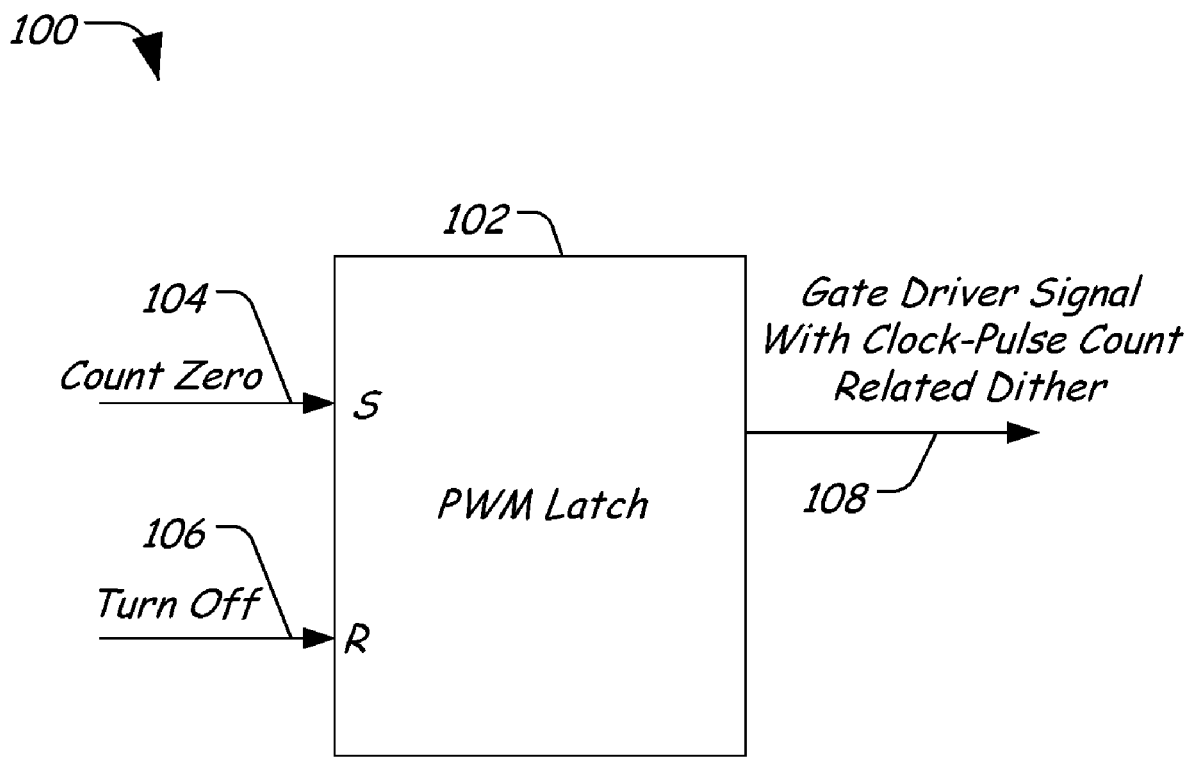
FIG. 1 is a block diagram of a particular illustrative embodiment of a circuit device to produce a gate driver signal with programmable dither.

FIG. 1 is a block diagram of a particular illustrative embodiment of a circuit device 100 to produce a gate driver signal with programmable dither. The circuit device 100 includes a pulse width modulated (PWM) latch circuit 102 having a first input 104 to receive a count zero signal and a second input 106 to receive a turn off signal. The PWM latch circuit 102 further includes an output 108 that can be coupled to a gate driver of a power converter or a motor. The PWM latch circuit 102 is adapted to generate a gate driver signal with dither that is related to a clock pulse. In a particular example, the count zero signal received via the first input 104 defines a first edge (such as a rising edge) of a pulse of a gate driver signal (such as a PWM signal), and the turn off signal received via the second input 106 defines a second edge (such as a falling edge) of the pulse of the gate driver signal.

In a particular embodiment, the count zero signal received via the first input 104 can be produced using a first counter having a programmable reset threshold to produce the count zero signal and using a second counter adapted to selectively or periodically change (increment or decrement) a reset threshold associated with the first counter. In a particular embodiment, by altering the reset threshold, timing associated with a rising edge of a pulse width modulated (PWM) pulse of an output signal related to the count zero signal can be adjusted (delayed) by a portion of a PWM frame to create noise in the PWM output signal, which noise spreads energy in the PWM power spectrum away from selected frequencies. In a particular example, the first and second counters are responsive to a common clock signal.

Figure 2:
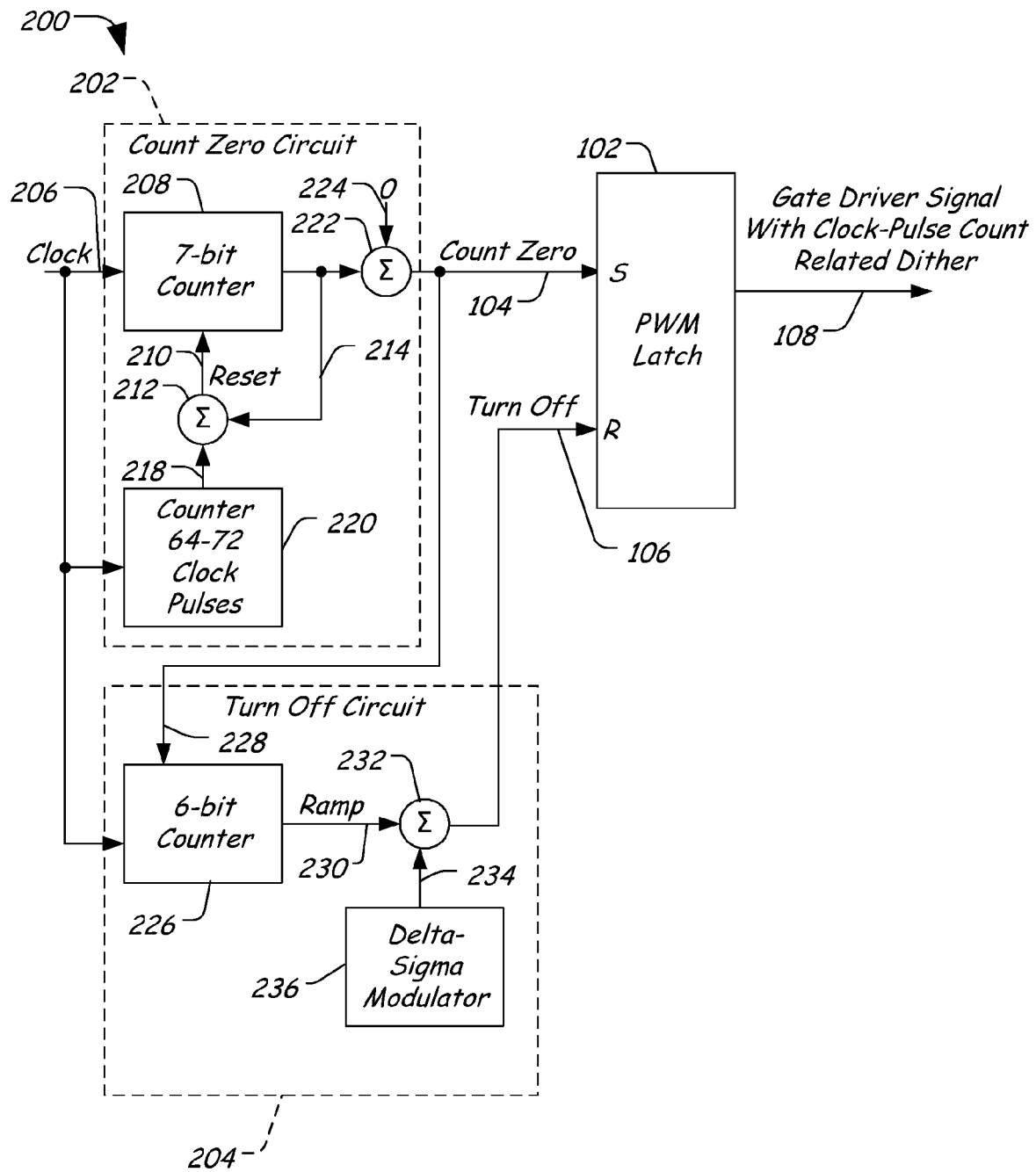
FIG. 2 is a block diagram of a second particular illustrative embodiment of a circuit device to produce a gate driver signal with programmable dither.

FIG. 2 is a block diagram of a second particular illustrative embodiment of a circuit device 200 to produce a gate driver signal with programmable dither. The circuit device includes a count zero circuit 202 coupled to a pulse width modulated (PWM) latch circuit 102 via a first input 104 and includes a turn off circuit 204 coupled to the PWM latch circuit 102 via a second input 106. The PWM latch circuit 102 includes an output 108. The PWM latch circuit 102 is adapted to generate a PWM output signal related to data received from the count zero circuit 202 and from the turn off circuit 204.

The count zero circuit 202 includes a clock input 206 to receive a clock signal. The count zero circuit 202 further includes a first counter circuit 208, such as a 7-bit counter, and includes a second counter circuit 220, which can be adapted to count up and down (increment and decrement) between a first value (threshold) and a second value (threshold). The second counter 220 produces a reset control signal 218 that can be combined with an output 214 of the first counter circuit 208 at a node 212 to produce a threshold reset signal 210 to change a reset threshold of the first counter circuit 208. The output 214 is combined with a zero input 224 at a second node 222, which is coupled to the first input 104 to provide a count zero signal to the PWM latch circuit 102.

The turn off circuit 204 includes a third counter circuit 226, such as a six-bit counter, that is responsive to the clock input 206 to receive the clock signal and the count zero signal at the first input 104. The third counter circuit 226 is adapted to generate a ramp signal that is provided to a node 232 via line 230. The node 232 receives the ramp signal via the line 230 and receives a delta-sigma signal from a delta-sigma module 236 via a line 234. The node 232 mixes the ramp signal and the delta-sigma signal to produce a turn off signal that is provided to the PWM latch circuit 102 via the second input 106.

In a particular embodiment, the second counter circuit 220 and the first counter circuit 208 are adapted to reset at the same clock pulse of the clock signal received via the clock input 206. On reset, the second counter circuit 220 increments (or decrements) a reset threshold of the first counter circuit 208 via the reset control signal 218. In a particular example, the second counter circuit 220 is adapted to generate a reset control signal 218 representing a clock pulse value within a range from 64 to 72 clock pulses, such that the first counter circuit 208 resets in response to receiving the corresponding clock pulse. After each reset of the first counter circuit 208, the second counter 220 increments (or decrements) the reset threshold via the reset control signal 218.

In a particular illustrative example, the second counter 220 is adapted to increment the reset control signal 218 from 64 to 72 clock pulses and then to decrement from 72 to 64 clock pulses, causing a reset threshold of the first counter circuit 208 to increase and then to decrease. Over time, the reset threshold of the first counter circuit 208 varies from one count zero cycle to the next so that the output gate drive signal at the output 108 of the PWM latch circuit 102 includes dither, which spreads energy at a carrier frequency and harmonics of the carrier frequency, reducing electromagnetic interference (EMI) that might otherwise interfere with adjacent receiver circuitry.

Figure 3:
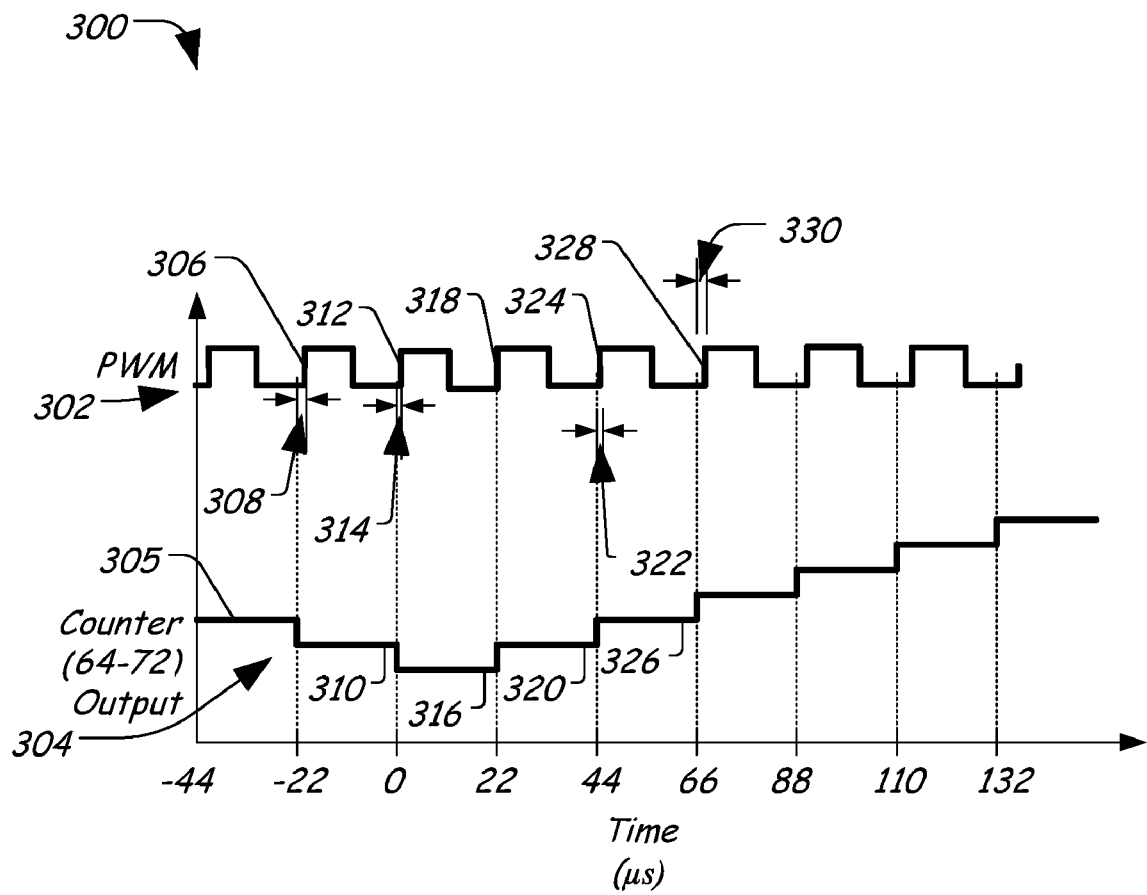
FIG. 3 is a timing diagram of a particular illustrative embodiment of an output signal and a counter reset adjustment signal to adjust timing associated with a rising edge of the output signal.

FIG. 3 is a timing diagram 300 of a particular illustrative embodiment of an output signal 302, such as a pulse width modulated (PWM) output signal, and a counter reset adjustment signal 304 to adjust timing associated with a rising edge of the output signal. In this particular example, the counter reset adjustment signal 304 varies between levels representing clock pulses 64 to 72 clock pulses. A pulse of the output signal 302 includes a rising edge 306 that varies by a delta 308 based on a value of the counter reset adjustment signal 304 at 305. The delta 308 represents a time variance between a default timing and a reset adjusted timing of a rising edge of the output signal 302. When the zero counter circuit is reset, the counter reset adjustment signal 304 is decremented at 310, and a rising edge 312 varies by a delta 314 based on a value of the counter reset adjustment signal 304 at 310. In this example, the delta 314 is smaller than the delta 308. Further, on a next reset of the count zero circuit, the counter reset adjustment signal 304 is decremented at 316. In this particular example, the level of the counter reset adjustment signal 304 corresponds to a reset threshold of 64 clock pulses.

At a rising edge 318 of the next pulse of the output signal 302, the delta is zero. In this particular example, the reset threshold of 64 clock pulses can represent a default reset value. When the counter reset adjustment signal 304 increments at 320, a delta 322 is introduced by a delay in the rising edge 324 of the output signal 302. Further, after another count zero reset, the counter reset adjustment signal 304 again increments to a level indicated at 326, which causes the rising edge 328 to be delayed by a delta 330, which is greater than the delta 322.

By incrementing a reset value of the first counter (such as the first counter 208 illustrated in FIG. 2) using a counter reset adjustment signal 304, the output signal 302 is varied to introduce dither (noise) in the output signal. Such dither reduces peak energy at selected frequencies by spreading the energy in the output power spectrum to nearby frequencies. By reducing peak energy, electromagnetic interference (EMI) is also reduced at the selected frequencies.

Figure 4:
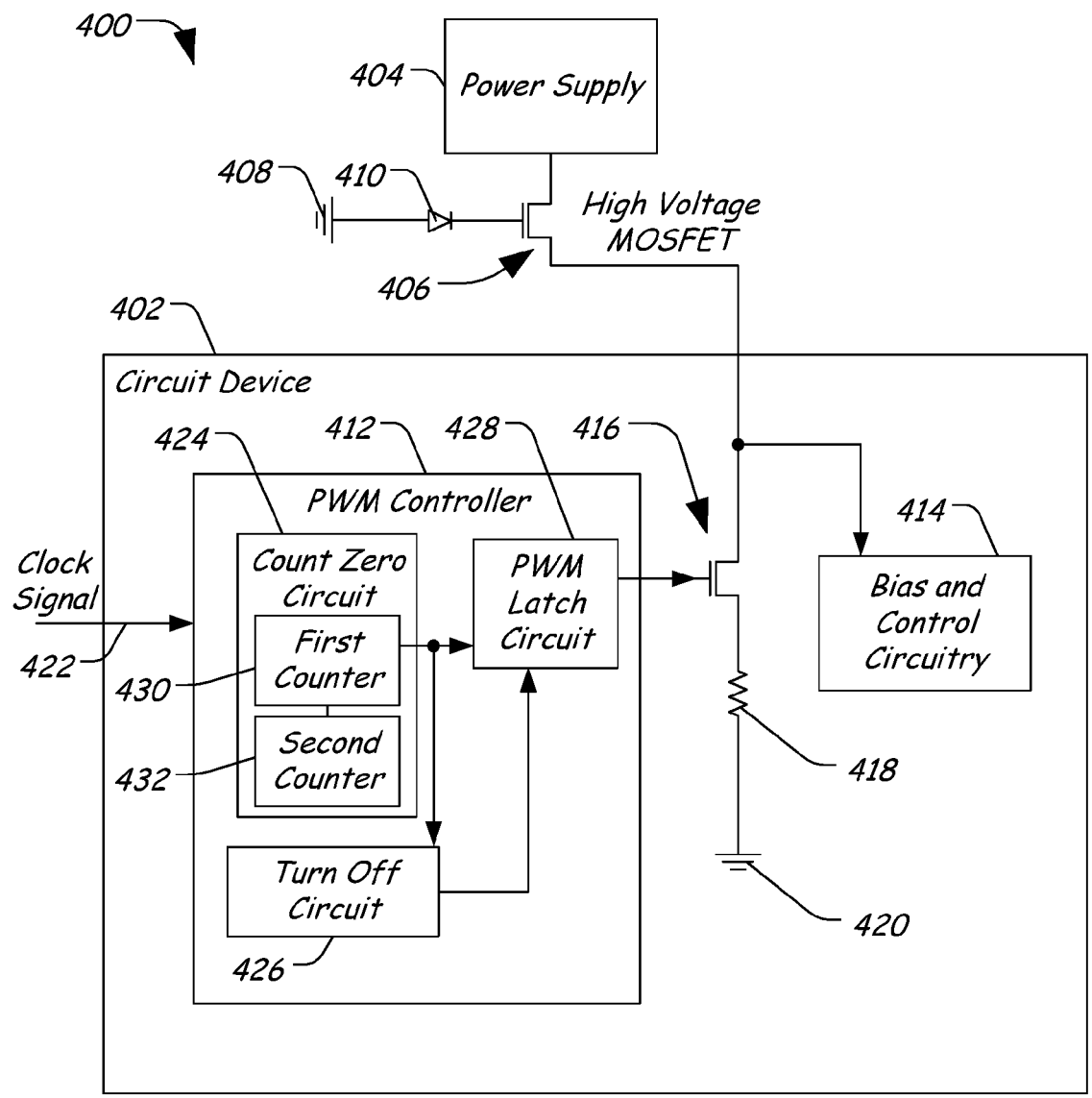
FIG. 4 is a diagram of a particular illustrative embodiment of a system including a circuit device to produce a gate driver signal with programmable dither.

FIG. 4 is a block diagram of a particular illustrative embodiment of a system 400 including a circuit device 402 to produce a gate driver signal with programmable dither. The system 400 includes a power supply 404 that is coupled to the circuit device 402 via a high voltage switch 406, such as a high voltage metal oxide semiconductor field effect transistor (MOSFET). In a particular embodiment, the high voltage switch 406 can be a p-channel transistor device that is active when a negative voltage or ground is applied to its control terminal. The high voltage switch 406 includes a first terminal coupled to the power supply 404, a second terminal coupled to the circuit device 402, and a control terminal coupled to a second power supply 408 via a diode 410. The second power supply 408 can be an electrical ground. In this instance, the diode 410 includes an anode terminal coupled to the second power supply 408 and a cathode terminal coupled to the control terminal of the high voltage switch 406 to bias the control terminal the high voltage switch 406 at a voltage level that is at least one diode drop below electrical ground 408, so that the high voltage switch 406 is biased into an active mode.

The circuit device 402 includes a pulse width modulated (PWM) controller 412 that is coupled to a control terminal of a switch 416. The switch 416 further includes a first terminal coupled to the second terminal of the high voltage switch 406 and a second terminal coupled to electrical ground 420 via a resistor 418. The circuit device 402 further includes bias and control circuitry 414 that is coupled to the first terminal of the switch 416.

The PWM controller 412 includes a count zero circuit 424 and a turn off circuit 426 that are coupled to a PWM latch circuit 428. The count zero circuit 424 includes a first counter circuit 430 and a second counter circuit 432. The first counter circuit 430 is adapted to generate a count zero signal related to a clock signal. Further, the first counter circuit 430 includes a programmable reset threshold. The second counter circuit 432 is adapted to selectively (or periodically) adjust the reset threshold of the first counter circuit 430. The turn off circuit 426 is adapted to generate a turn off signal. In a particular embodiment, the PWM latch circuit 426 is adapted to generate a PWM pulse based on the received count zero signal and the turn off signal. In a particular example, the count zero signal defines a rising edge of the PWM pulse and the turn off signal defines a falling edge of the PWM pulse. In an alternative embodiment, the count zero signal can define a falling edge of the PWM pulse and the turn off signal can define a rising edge of the PWM pulse.

In a particular embodiment, the PWM controller 412 receives a clock signal via a clock input 422. The count zero circuit 424 generates a count zero signal when a count of clock pulses of the clock signal reaches a programmable reset threshold. The count zero signal triggers a rising edge of an output signal of the PWM latch circuit 426. The turn off circuit 424 receives the count zero signal and subsequently generates a turn off signal based on the clock signal. The turn off signal triggers a falling edge of the output signal of the PWM latch circuit 426.

The second counter circuit 430 alters (increments or decrements) the programmable reset threshold each time the first counter 428 is reset. Thus, with the next sequence of clock pulses, the first counter reaches the altered programmable reset threshold and triggers the rising edge of the output signal. The altered programmable reset threshold may be greater than or less than the previous reset threshold.

In a particular embodiment, the rising and falling edges of the output signal are provided as a sequence of PWM pulses to control activations of the switch 416, producing an output power supply that switches in conjunction with the PWM pulses to the bias and control circuitry 414. By altering the timing of the rising edge of the PWM pulses over time, dither is introduced in the output power spectrum, reducing peak energy at selected frequencies.

Figure 5:
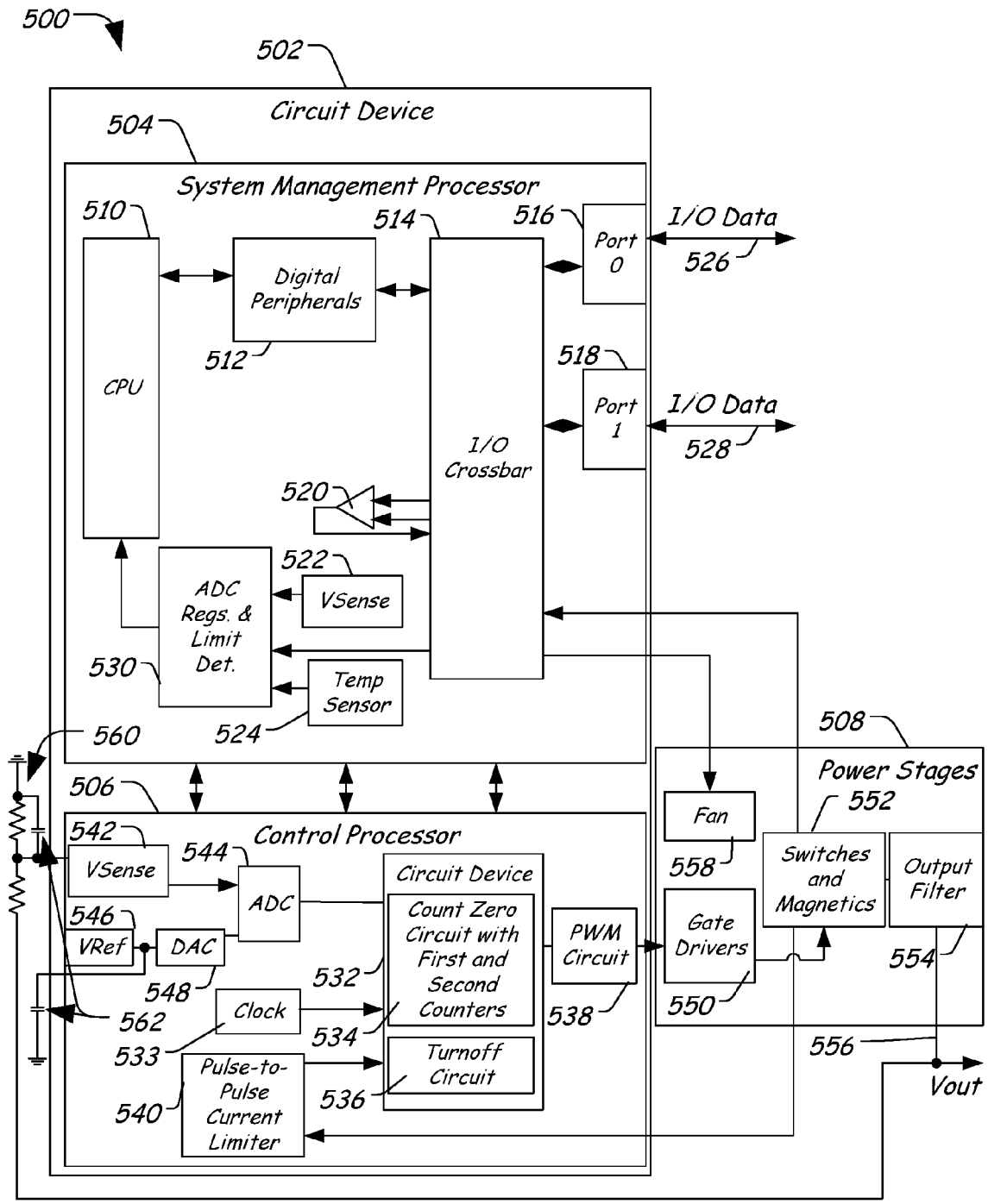
FIG. 5 is a diagram of a second particular illustrative embodiment of a system including a circuit device to produce a gate driver signal with programmable dither.

FIG. 5 is a diagram of a second particular illustrative embodiment of a system 500 including a circuit device 502 to produce a gate driver signal with programmable dither. The circuit device 502 is adapted to communicate data to one or more devices via first and second input/output (I/O) buses 526 and 528. Further, the circuit device 502 is adapted communicate with at least one power stage 508, which includes a switch (switches and magnetic circuitry 552) that is controlled by a gate drive signal with programmable dither, to produce an output power supply (Vout) via an output 556.

The circuit device 502 includes a system management processor circuit 504 that communicates with the first and second I/O buses 526 and 528 and with the at least one power stage 508. Further, the circuit device 502 includes a control processor 506 that is adapted to generate a pulse width modulated (PWM) signal including dither to control gate drivers 550 of the at least one power stage 508.

The system management processor circuit 504 includes a processor 510 (such as a central processing unit (CPU)) that is adapted to communicate with one or more digital peripheral circuits 512, which are coupled via an I/O crossbar 514 to first and second I/O ports 516 and 518. The digital peripheral circuits 512 can include timers, a multi-channel counting array, a system management bus (SMBus) port, other ports, or any combination thereof. The first and second I/O ports 516 and 518 are coupled to the I/O buses 526 and 528, respectively. The I/O crossbar 514 is coupled to a comparator 520 to monitor data and signal levels associated with the first and second I/O ports 516 and 518 and the at least one power stage 508. Further, the I/O crossbar 514 is coupled to a fan circuit 558 of the at least one power stage 508. Additionally, the I/O crossbar 514 is coupled to analog-to-digital converter (ADC) registers and limit detection circuitry 530. The ADC registers and limit detection circuitry 530 is adapted to receive a sensed voltage (VSense) 522 and a sensed temperature from a temperature sensor 524. Further, the ADC registers and limit detection circuitry 530 is adapted to provide feedback to the processor 510.

The control processor 506 includes an ADC 544 having a first input to receive a sensed voltage (VSense) 542, which is received via a voltage divider circuit 560 that is coupled to the output 556. Further, a second input is adapted to receive an analog signal from a digital-to-analog converter (DAC) 548 that is related to a reference voltage (Vref) 546. The reference voltage (Vref) 546 is also coupled to ground via a capacitor to filter the reference voltage. The ADC 544 provides digital data related to the sensed voltages to a circuit device 532. The circuit device 532 receives a clock signal 533. Further, the circuit device 532 includes a count zero circuit with first and second counters 534 and a turn off circuit 536.

In a particular example, the first counter of the count zero circuit 534 is adapted to generate a count zero output related to its programmable threshold and the second counter is adapted to alter the programmable threshold each time the first circuit is reset. The turn off circuit 536 produces a turn off signal related to the count zero output and to the clock signal 533. The control processor 506 further includes a pulse width modulated (PWM) circuit 538 to receive the count zero signal and the turn off signal. The PWM circuit 538 uses the count zero output to define a rising (or falling) edge of a pulse width modulated (PWM) output and uses the turn off signal to define a falling (or rising) edge of the PWM output, which PWM output is a gate driver signal that is provided to one or more gate driver circuits 550 of the at least one power stage 508. The control processor 506 further includes a pulse-to-pulse current limiter circuit 540 that receives feedback from the at least one power stage 508 to limit an output current level of the PWM output.

The at least one power stage 508 includes a fan 558 that is controllable via a line from the I/O crossbar 514. Further, the at least one power stage 508 includes gate driver circuits 550 that are coupled to switches and magnetics circuitry 552 to provide a switched power supply via an output filter 554 (such as a capacitor) to the output 556. The switches and magnetics circuitry 552 also provides feedback to the system management processor 504 and to the control processor 506.

The system 500 illustrates a system management processor 504 and a control processor 506 to control a non-isolated direct current to direct current (DC/DC) converter operating in a digital voltage control mode. The output voltage signal (Vout) at the output 556 is coupled to the VSense input 542 via a resistive divider circuit 560. The VSense input 542 operates to limit a common-mode voltage range applied to the ADC 544 to a maximum voltage associated with the reference voltage 546. The resistive divider circuit 560 and capacitive filters 562 can operate to form an anti-aliasing filter with a cutoff frequency that is approximately equal to a sampling frequency of the ADC 544 divided by two. In a particular example, amplitudes of frequencies above the sampling frequency divided by two are reduced to prevent aliasing.

The ADC 544 and the circuit device 532 together operate as an analog error amplifier and associated resistor-capacitor (RC) compensation network. The ADC 544 digitizes a difference between a scaled output voltage and a programmable reference voltage (Vref) 546. The output signal of the ADC 544 is frequency compensated (in the digital domain) by the circuit device 532. The circuit device 532 provides a count zero output and a turn off output that represent a digital code that represents a compensated duty cycle ratio. The PWM circuit 538 can directly vary output timing to the external gate drivers based on the count zero signal to reduce electromagnetic interference.

In a particular embodiment, sensing circuitry (such as a current transformer, sense amplifier, other sense circuitry, or any combination thereof) within the at least one power stage 508 provides a signal representative of an inductor or transformer current. This signal connects to the pulse-to-pulse current-limiter circuit 540, which includes a fast analog comparator and a programmable leading-edge blanking circuit to prevent unwanted tripping of the current-sensing circuitry on the leading edge of the current pulse. Current limiting may occur when the sensed current exceeds the programmed threshold, and on-going active portions of the PWM output may be terminated.

It should be understood that the above-example is illustrative only, and is not intended to be limiting. In a particular example, a digital filter may be included between the ADC 544 and the circuit device 532. Alternatively, the count zero circuit 534 and the turn off circuit 536 may be included within a digital signal processing (DSP) filter or may be included in difference circuits. In still another particular embodiment, the PWM output signal may be provided to a single power stage or multiple power stages.

Figure 6:
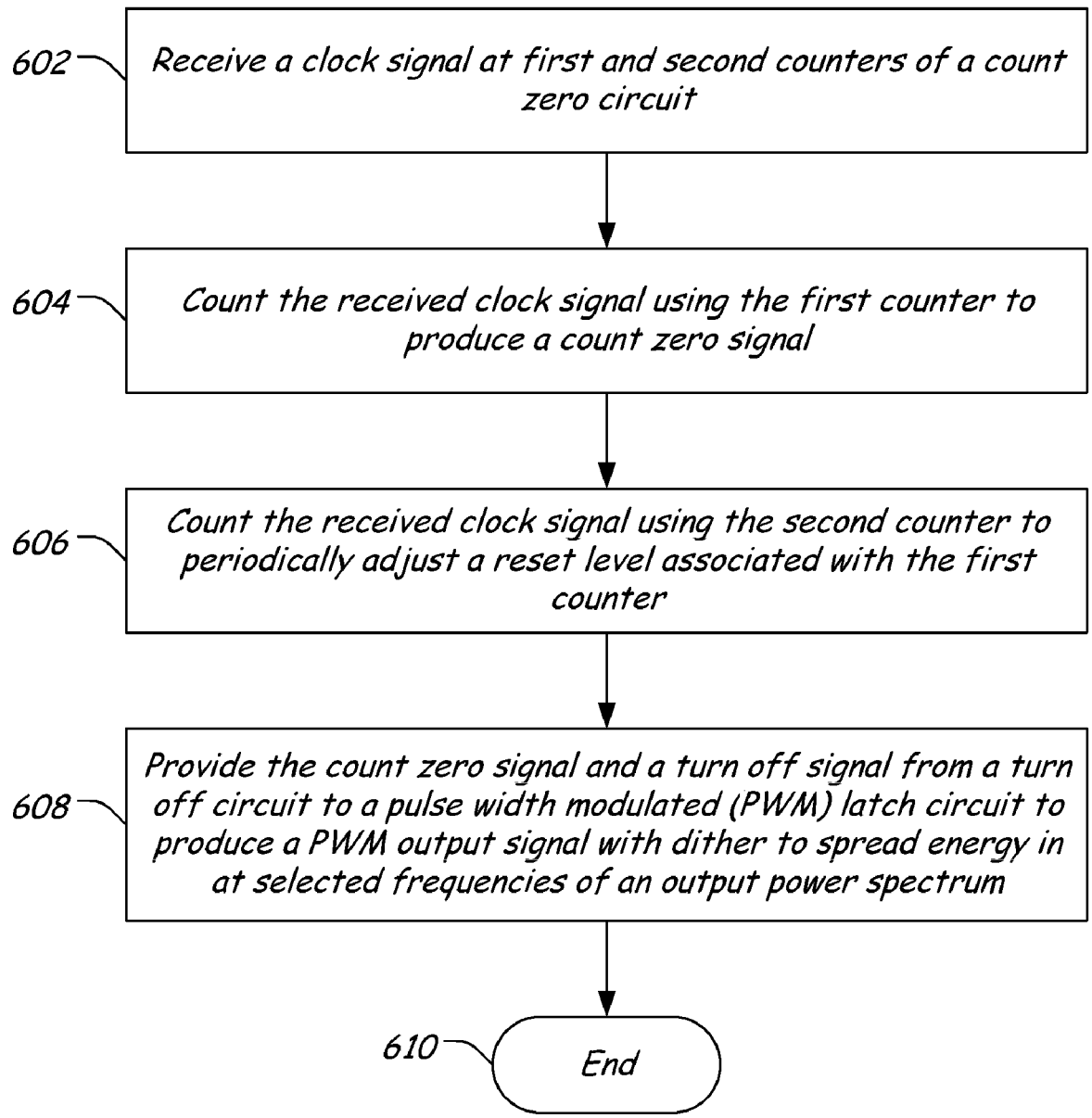
FIG. 6 is a flow diagram of a particular illustrative embodiment of a method of adjusting timing associated with a rising edge of an output signal.

FIG. 6 is a flow diagram of a particular illustrative embodiment of a method of adjusting timing associated with a rising edge of an output signal. At 602, a clock signal is received at first and second counters of a count zero circuit. In a particular embodiment, the first counter can be a seven-bit counter, and the second counter can be a six-bit counter. Advancing to 604, the received clock signal is counted using the first counter to produce a count zero signal. In a particular example, the first counter is adapted to count zero values within the clock signal and to reset each time the reset count threshold is reached.

Continuing to 606, the received clock signal is counted using the second counter to periodically adjust a reset level associated with the first counter. In a particular example, the second counter is adapted to count up and down within a range of values to increment or decrement a reset threshold value of the first counter each time the first counter is reset. In a particular example, the reset threshold value varies between a minimum over sampling ratio (i.e., two times the sampling rate) and another value, which causes the PWM output signal to vary slightly from pulse to pulse, introducing dither. Proceeding to 608, the count zero signal and a turn off signal from a turn off circuit are provided to a pulse width modulated (PWM) Latch circuit to produce a PWM output signal with dither to spread energy at selected frequencies of an output power spectrum. In a particular example, the dither frequency is 3.3 kHz within the bandwidth of quasi-peaks for conducted electromagnetic interference (EMI) and which is smaller than a bandwidth of the system to correct for this frequency change. Thus, the output does not see this frequency change (i.e., does not see a ripple due to the dither). The method terminates at 610.

In a particular embodiment, the reset value of the first counter is determined by a count value from the second counter. By varying the reset value of the first counter using the second counter, a rising edge of the PWM output signal can be varied to introduce dither into the PWM output signal. Such dither is programmable via a register or other input coupled to the second counter to adjust a reset value associated with the second counter. In a particular example, the second counter is a six bit counter that is adapted to vary the reset threshold of the first counter between 64 and 72 clock pulses. In another particular example, the second counter can be adjusted to vary the reset threshold of the first counter between 64 and 74 clock pulses. In another particular embodiment that involves a first counter having a different number of bits and/or having a different output frequency, the counter may be adjusted to a different range of clock pulses.

In conjunction with the circuit devices and methods described above with respect to FIGS. 1-6, a circuit device is disclosed that includes a first counter having a programmable reset threshold and adapted to generate a count zero output related to a clock signal. The circuit device further includes a second counter to vary the programmable reset threshold of the first counter based on the clock signal. In a particular example, the second counter increments or decrements the reset threshold of the first circuit each time the first circuit is reset. In a particular embodiment, the second circuit is programmable to define a range of reset threshold values for the first counter. In a particular example, the second circuit can be configured to vary (increment or decrement) the reset threshold of the first counter each time the first counter is reset between 64 clock pulses and 72 clock pulses. In another particular example, the second circuit can be configured to vary the reset threshold of the first counter within a range from 64 clock pulses to 80 clock pulses. In yet another example, the range can have a first and second reset values that define the range. In a particular embodiment, the range of values may be selected based on a frequency range to be suppressed in connection with a switched output voltage.

Although the present invention has been described with reference to preferred embodiments, workers skilled in the art will recognize that changes may be made in form and detail without departing from the spirit and scope of the invention.

What is claimed is:

1. A circuit device comprising:
   a count zero circuit including a first counter to receive a clock signal and to produce a count zero signal based on the clock signal and including a second counter to generate a reset control signal to control a reset of the count zero circuit;
   a turnoff circuit to receive the clock signal and to produce a turn off signal based on the clock signal; and
   a pulse width modulated (PWM) latch circuit adapted to produce a gate drive signal based on the count zero signal and the turn off signal;
   wherein timing of an edge of the gate drive signal varies based on the reset control signal.

2. The circuit device of claim 1, wherein the PWM latch circuit is adapted to produce a rising edge in the gate drive signal in response to the count zero signal and to produce a falling edge in the gate drive signal in response to the turn off signal.

3. The circuit device of claim 1, wherein the second counter is adapted to increment the reset control signal to a programmable threshold.

4. The circuit device of claim 3, wherein the second counter decrements the reset control signal after the programmable threshold is reached.

5. The circuit device of claim 4, wherein the second counter is adapted to count from a low threshold to the programmable threshold.

6. The circuit device of claim 5, wherein the count zero circuit delays a reset of the first counter according to the reset control signal.

7. The circuit device of claim 1, wherein the first counter comprises a seven-bit counter, and wherein the second counter comprises a six bit counter.

8. The circuit device of claim 1, wherein the gate drive signal comprises a pulse width modulated signal including dither to reduce electromagnetic interference (EMI).

9. A circuit device comprising:
a count zero circuit comprising:
a first counter to receive a clock signal and to generate a count zero signal related to the clock signal, the first counter including a programmable reset threshold to control when the first counter circuit is reset; and
a second counter to receive the clock signal and to produce a reset control signal related to the clock signal to adjust the programmable reset threshold;
a pulse width modulated (PWM) latch circuit responsive to the count zero signal to produce a gate drive signal having a first pulse edge related to the count zero signal;
a turn off circuit to receive the count zero signal and to generate a turn off signal related to the clock signal and the count zero signal, the turn off circuit to provide the turn off signal to the PWM latch circuit; and
wherein the PWM latch circuit is responsive to the turn off signal to produce a second pulse edge opposite to the first pulse edge.

10. The circuit device of claim 9, wherein the first counter and the second counter reset simultaneously.

11. The circuit device of claim 9, wherein the second counter is adapted to increment the programmable reset threshold from a first reset threshold to a second reset threshold.

12. The circuit device of claim 11, wherein the second counter is adapted to decrement the programmable reset threshold from the second reset threshold to the first reset threshold after the second reset threshold is reached.

13. The circuit device of claim 12, wherein a rising edge of the gate drive signal is time-varying based on the programmable reset threshold.

14. The circuit device of claim 9, wherein the gate drive signal is provided to at least one gate driver circuit of a power circuit.

15. A system comprising:
a control processor circuit to produce a pulse width modulated (PWM) signal including dither, the control processor circuit comprising:
a count zero circuit including a first counter circuit to produce a count zero signal and a second counter circuit to control a reset threshold associated with the first counter circuit;
a turn off circuit to produce a turn off signal; and
a PWM circuit to receive the count zero signal and the turn off signal, the PWM circuit adapted to produce a gate drive signal having a first edge related to the count zero signal and a second edge corresponding to the turn off signal;
wherein a timing associated with the first and second edges vary according to the reset threshold.

16. The system of claim 15, further comprising at least one power stage including a gate drive responsive to the gate drive signal to produce an output voltage.

17. The system of claim 16, wherein at least one power stage includes a switch circuit responsive to the system management processor circuit to selectively enable and disable the output voltage.

18. The system of claim 15, wherein the first counter circuit, the second counter circuit, and the turn off circuit are responsive to a clock signal.

19. The system of claim 18, wherein a reset threshold output of the second counter circuit changes each time the first counter circuit resets.

20. The system of claim 18, wherein the first edge comprises a rising edge of a pulse of the gate drive signal, and wherein the second edge comprises a falling edge of the pulse of the gate drive signal.

* * * * *